(12) United States Patent
Lue

(10) Patent No.: US 10,847,535 B2
(45) Date of Patent: Nov. 24, 2020

(54) THREE DIMENSIONAL MEMORY DEVICE AND METHOD FOR FABRICATING THE SAME

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 39 days.

(21) Appl. No.: 16/231,644

(22) Filed: Dec. 24, 2018

(65) Prior Publication Data

US 2020/0203363 A1 Jun. 25, 2020

(51) Int. Cl.
| | |
|---|---|
| H01L 27/11556 | (2017.01) |
| H01L 27/11524 | (2017.01) |
| H01L 27/1157 | (2017.01) |
| H01L 27/115 | (2017.01) |
| H01L 27/11582 | (2017.01) |
| H01L 27/11565 | (2017.01) |
| H01L 21/311 | (2006.01) |

(Continued)

(52) U.S. Cl.
CPC ... *H01L 27/11582* (2013.01); *H01L 21/31111* (2013.01); *H01L 21/76224* (2013.01); *H01L 27/11565* (2013.01); *H01L 29/40114* (2019.08); *H01L 29/40117* (2019.08)

(58) Field of Classification Search
CPC ..... G11C 5/063; H01L 27/249; H01L 27/228; H01L 27/224
See application file for complete search history.

(56) References Cited

U.S. PATENT DOCUMENTS

| 9,748,264 B1 | 8/2017 | Jiang et al. |
| 2010/0207194 A1 | 8/2010 | Tanaka et al. |

(Continued)

FOREIGN PATENT DOCUMENTS

KR  10-0956985 B  5/2010

OTHER PUBLICATIONS

TIPO Office Action dated Sep. 11, 2019, Taiwan Application No. 107146851, pp. 1-6.

(Continued)

*Primary Examiner* — Brian Turner
(74) *Attorney, Agent, or Firm* — McClure, Qualey & Rodack, LLP

(57) ABSTRACT

A 3D memory device includes a multi-layers stacking structure having an O-shaped opening; a memory structure layer having a first string portion and a second string portion disposed on two opposite sides of a sidewall of the O-shaped opening and a connection portion disposed on a bottom of the O-shaped opening and connecting the first and the second string portion; a dielectric pillar disposed in the O-shaped opening and over the connection portion; an isolation body extending along a direction and embedded among the first string portion, the second string portion and the connection portion to isolate the first string portion from the second string portion; a first contact disposed in a first recess defined by the first string portion, the dielectric pillar and the isolation body; and a second contact disposed in a second recess defined by the second string portion, the dielectric pillar and the isolation body.

15 Claims, 15 Drawing Sheets

(51) Int. Cl.
*H01L 21/762* (2006.01)
*H01L 21/28* (2006.01)

(56) References Cited

U.S. PATENT DOCUMENTS

| | | | | |
|---|---|---|---|---|
| 2014/0070302 | A1* | 3/2014 | Yoo | H01L 27/11582 |
| | | | | 257/324 |
| 2015/0340370 | A1* | 11/2015 | Kim | H01L 21/76897 |
| | | | | 365/185.18 |
| 2016/0260733 | A1 | 9/2016 | Lue | |
| 2017/0148808 | A1* | 5/2017 | Nishikawa | H01L 27/11582 |
| 2017/0358590 | A1* | 12/2017 | Kang | H01L 27/11524 |
| 2020/0098774 | A1* | 3/2020 | Yeh | H01L 27/11565 |

OTHER PUBLICATIONS

Machine Translation—TIPO Office Action dated Sep. 11, 2019, Taiwan Application No. 107146851, pp. 1-5.

* cited by examiner

THREE DIMENSIONAL MEMORY DEVICE AND METHOD FOR FABRICATING THE SAME

BACKGROUND

Technical Field

The disclosure in generally relates to a memory device and method for fabricating the same, and more particularly to a high-density three dimensional (3D) memory device and method for fabricating the same.

Description of the Related Art

Memory devices are important device to a portable electric apparatus, such as a MP3 displayer, a digital camera, a notebook, a cell phone . . . and so on, for data storage. As the increasement of applications and functions required by the users, the trend for the memory devices pursues higher storage density and smaller cell size. To satisfy this requirement, designers have been looking for techniques to provide a 3D memory device with stacked multiple planes of memory cells, such as a vertical-channel (VC) NAND flash memory device.

However, as critical dimensions of devices in integrated circuits shrink to the limits of common memory cell technologies, how to achieve greater storage capacity within a smaller memory device without deteriorate its operation performance have become a challenge to the persons skilled in the art. Therefore, there is a need of providing an improved 3D memory device and the method for fabricating the same to obviate the drawbacks encountered from the prior art.

SUMMARY

One aspect of the present disclosure is to provide a 3D memory device, wherein the 3D memory device includes a substrate, a plurality conductive layers, a plurality of insulating layers, a memory structure layer, a dielectric pillar, an isolation body, a first contact plug and a second contact plug. The insulating layers are alternately stacked with the conductive layers on the substrate to form a multi-layers stacking structure, wherein the multi-layers stacking structure has at least one O-shaped opening passing through the conductive layers and the insulating layers. The memory structure layer has a first string portion disposed on one side of a sidewall of the O-shaped opening, a second string portion disposed on another side of the sidewall and a connection portion disposed on a bottom of the O-shaped opening and used to connecting the first string portion and the second string portion. The dielectric pillar is disposed in the O-shaped opening and over the connection portion. The isolation body extends along a direction from a top surface of the multi-layers stacking structure towards to the substrate and embedded among the first string portion, the second string portion and the connection portion to isolate the first string portion from the second string portion. The first contact is disposed in a first recess defined by the first string portion, the dielectric pillar and the isolation body; and the second contact is disposed in a second recess defined by the second string portion, the dielectric pillar and the isolation body.

Another aspect of the present disclosure is to provide a method for fabricating a 3D memory device, wherein the method includes steps as follows: A multi-layers stacking structure including a plurality conductive layers and a plurality of insulating layers alternately stacked on a substrate is firstly provided. Next, the multi-layers stacking structure is patterned to form at least one O-shaped opening penetrating through the conductive layers and the insulating layers. A memory structure layer is then formed to cover a sidewall and a bottom of the O-shaped opening. The O-shaped opening is then full-filled by a dielectric material, and an etch back process is performed removing a portion of the dielectric material to form a dielectric pillar in the O-shaped opening. Next, a column plug is formed in the O-shaped opening by using a conductive material to full-fill the O-shaped opening. Subsequently, an etching process is performed to form a groove extending form a top surface of the multi-layers stacking structure towards to the substrate and passing through the column plug, a portion of the dielectric pillar, a portion of the memory structure layer and a portion of the multi-layers stacking structure to divide the column into a first contact plug and a second contact plug and to divide the memory structure layer into a first string portion disposed on one side of the sidewall, a second string portion disposed on another side of the sidewall and a connection portion connecting the first string portion with the second string portion. An isolation body used to isolate the first string portion from the second string portion is then formed among the first string portion, the second string portion and the connection portion by full-filling an insulation material into the groove.

In accordance with the aforementioned embodiments of the present disclosure, a 3D memory device and the method for fabricating the same are provided. A patterned multi-layers stacking structure having a least one O-shaped opening is firstly provided on a substrate. A memory structure layer (including a memory layer and a channel layer) is then formed on the sidewall and the bottom of the O-shaped opening to form a gate-all-around (GAA) memory cell string therein. Next the O-shaped opening is full-filled with a dielectric material, an etching back process is then performed to remove a portion of the dielectric material from the O-shaped opening, and the O-shaped opening is further full-filled with a conductive material, whereby a dielectric pillar and a column plug stacking in series can be formed in the O-shaped opening. Subsequently, an etching process is performed to form a groove to divide the column plug into two separated contact plugs and to divide the GAA memory cell string into two sub-memory cell strings connecting by the remaining (not being etched) portion of the memory structure layer disposed on the bottom of the O-shaped opening. As a result, an U-shaped memory cell string having a vertical channel is formed, wherein each of the cells used to constitute the U-shaped memory cell string has a U-shaped channel profile parallel to the top surface of the multi-layers stacking structure.

Because, the cells having a U-shaped channel profile may have a greater channel width, in comparison with the prior art memory cells having a plane channel structure, thus when the size of the memory cells having the U-shaped channel profile is relatively shrunk or the pitch between two adjacent cell strings constituted by the memory cells having the U-shaped channel profile is proportionally reduced, the performance thereof can be still identical to that of the prior art memory cells. Such that, more U-shaped memory cell strings can be formed in the multi-layers stacking structure. As a result, the storage density of the 3D memory device can be significantly increased. In addition, since the contact plugs can provide a landing area for the subsequent process performing hereon, the conductive contact pads provided by the prior art thus are not necessary. The process for fabricating the 3D device can be simplified and the manufacturing cost can be decreased.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
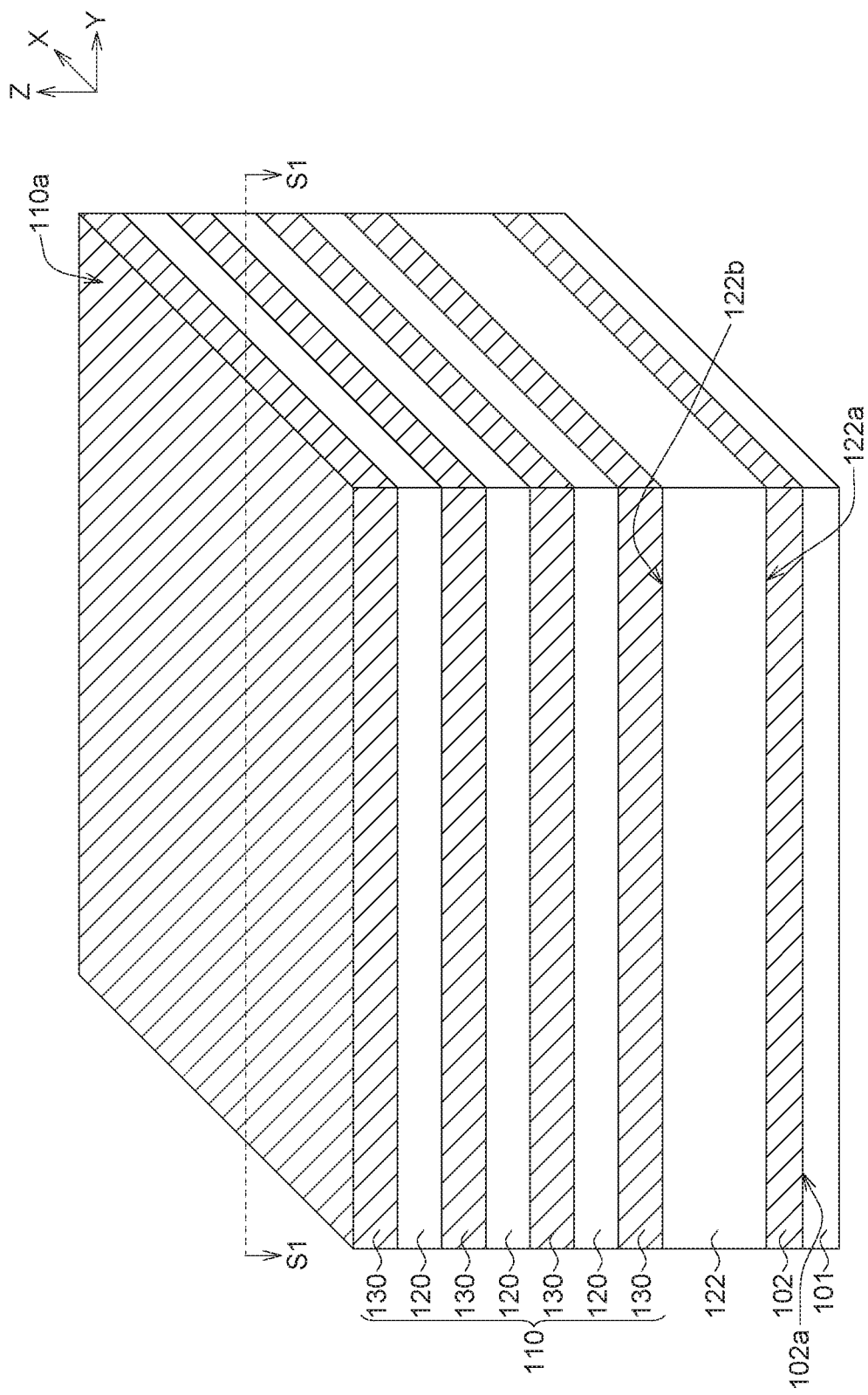
FIG. 1A is a prospective view illustrating a multi-layers stacking structure in accordance with one embodiment of the present disclosure.

The embodiments as illustrated below provide a 3D memory device and the method for fabricating the same to achieve greater storage capacity within a smaller memory device without deteriorating its operation performance. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

Figure 1B:
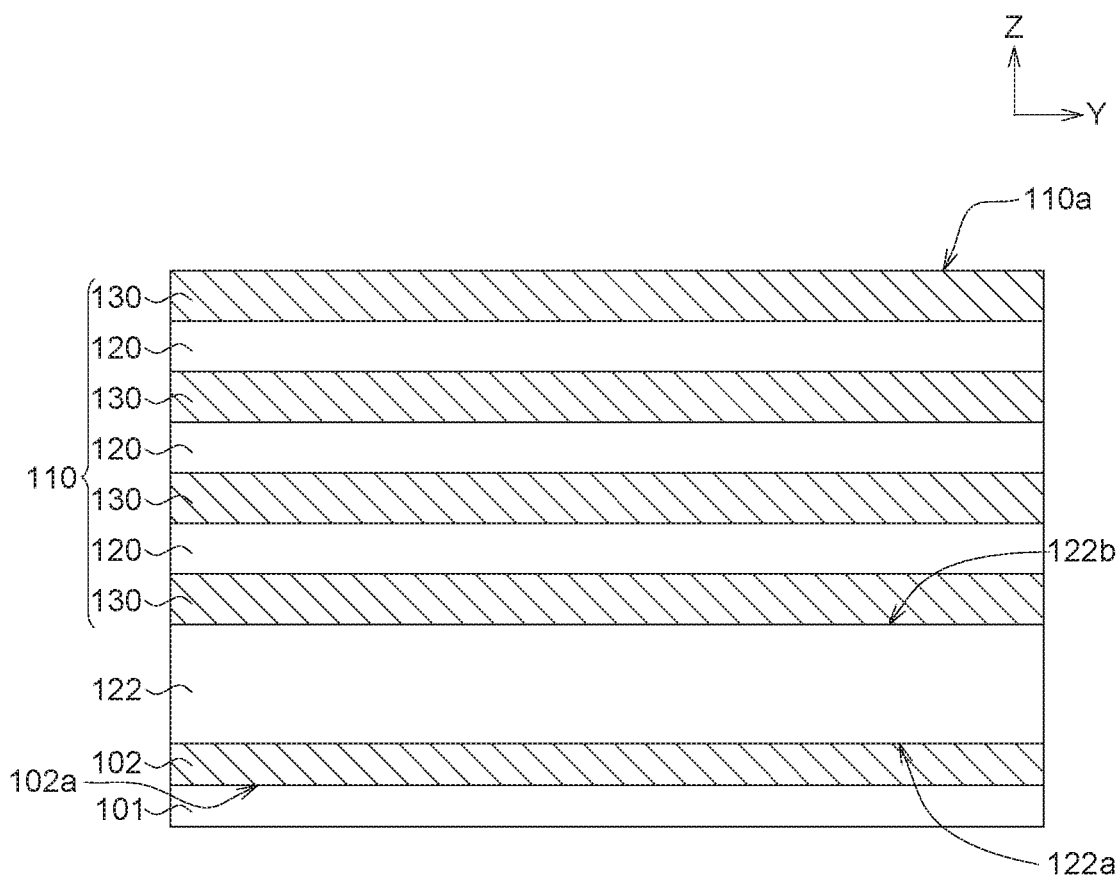
FIG. 1B is a cross-sectional view taken along the cutting line S1 as shown in FIG. 1A.

The method for fabricating the 3D memory device 100 includes steps as follows: Firstly, a multi-layers stacking structure 110 including a plurality of conductive layers 120 and a plurality of insulating layers 130 alternately stacked on a substrate 101 is firstly provided. FIG. 1A is a prospective view illustrating a multi-layers stacking structure 110 in accordance with one embodiment of the present disclosure; and FIG. 1B is a cross-sectional view taken along the cutting line S1 as shown in FIG. 1A.

In some embodiments of the present disclosure, the 3D memory device 100 may further include a bottom gate layer 122 and a buried oxide layer 102 disposed between the substrate 101 and the multi-layers stacking structure 110. In the present embodiment, the buried oxide layer 102 is formed by a thermal oxidation process directly performed on a surface of the substrate 101; the bottom gate layer 122 is formed by a process of depositing a conductive material on the buried oxide layer 102; and the conductive layers 120 and the plurality of insulating layers 130 are alternately stacked on the bottom gate layer 122 along a direction parallel to the Z-axis to form the multi-layer stacking structure 110. However, in some embodiments of the present disclosure, the buried oxide layer 102 can be also formed by a deposition process performed on the surface of the substrate 101.

The conductive layers 120 can be formed of metal (such as copper (Cu), aluminum (Al), tungsten (W) or the metal ally thereof), doped or undoped semiconductor material (such as epitaxial single crystal silicon or poly-silicon (Si)/germanium (Ge) or other suitable material. The insulating layers 130 can be formed of a dielectric material such as silicon oxide, silicon nitride, silicon oxynitride, silicate, or others. The buried oxide layer 102 can be formed of silicon oxide. The material made of the conductive layers 120 may be identical to or different from that made of the bottom gate layer 122; and the material made of the insulating layers 130 may be identical to or different from that made of the buried oxide layer 102.

Figure 2A:
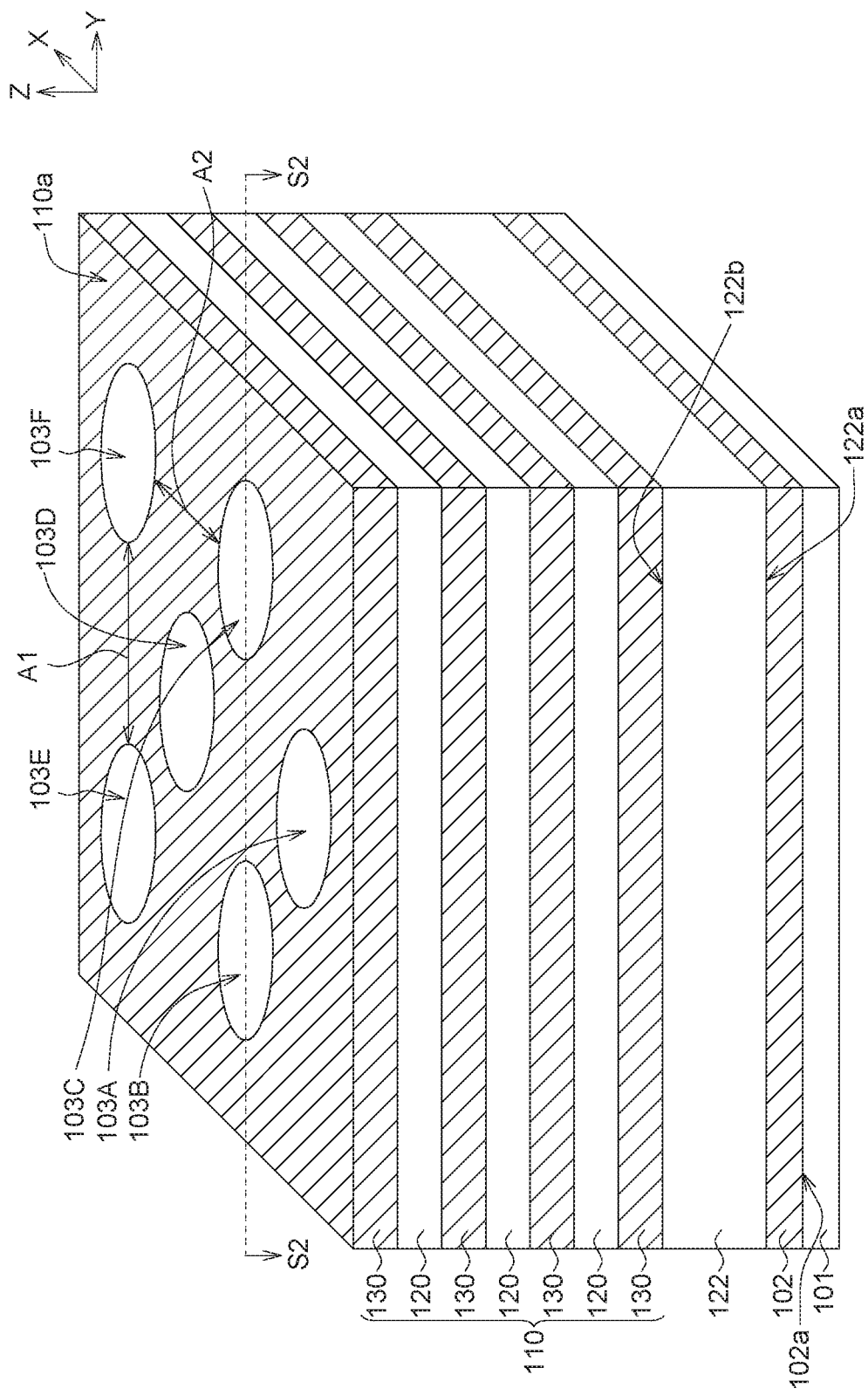
FIG. 2A is a prospective view illustrating the results after the multi-layers stacking structure is subjected to a patterning process to form a plurality of O-shaped openings.
Figure 2B:
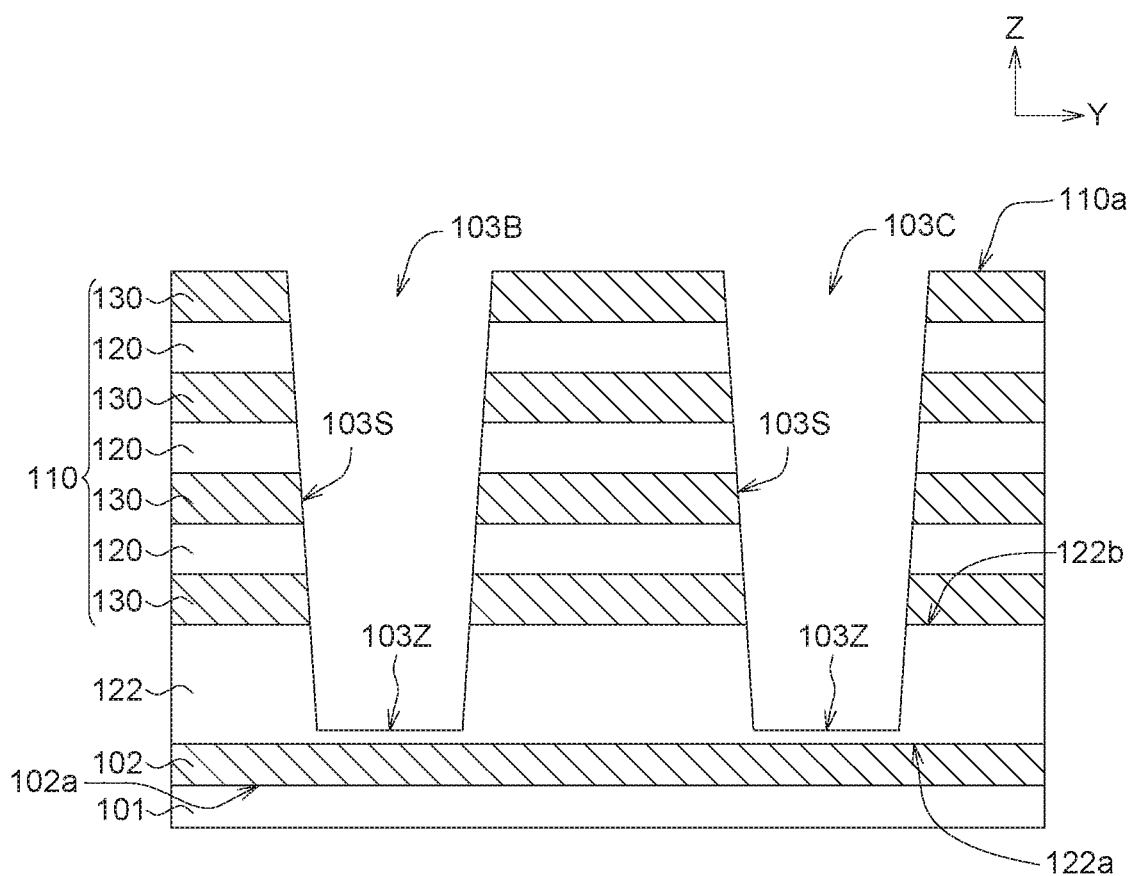
FIG. 2B is a cross-sectional view taken along the cutting line S2 as shown in FIG. 2A.
Figure 2C:
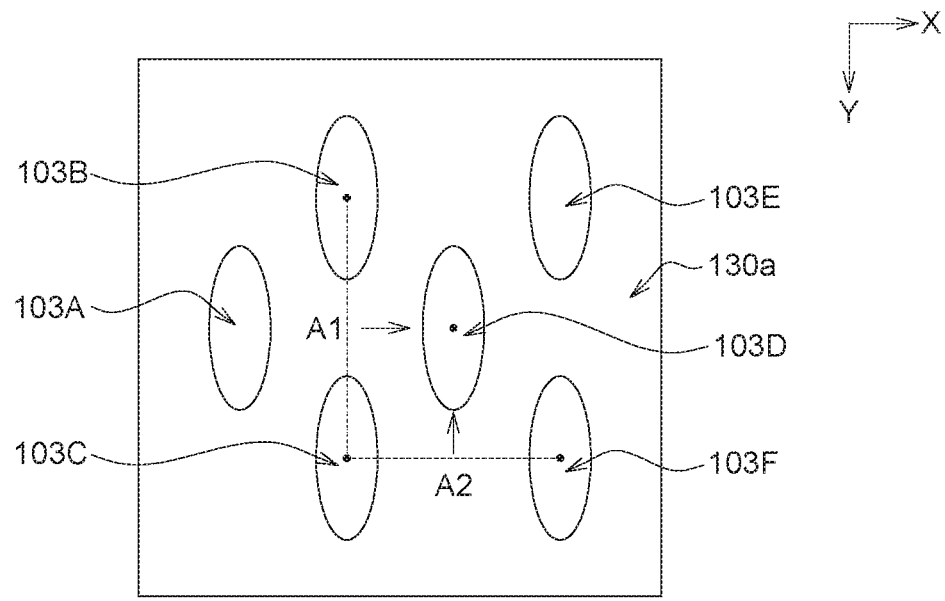
FIG. 2C is a top view of the structure as depicted in FIG. 2A.

Next, the multi-layer stack 110 is patterned to form a plurality of O-shaped openings 103A-103F penetrating through the conductive layer 120. FIG. 2A is a prospective view illustrating the results after the multi-layers stacking structure 110 is subjected to a patterning process to form a plurality of O-shaped openings 103A-103F; FIG. 2B is a cross-sectional view taken along the cutting line S2 as shown in FIG. 2A; and FIG. 2C is a top view of the structure as depicted in FIG. 2A.

In some embodiments of the present disclosure, the process for patterning the multi-layer stacking structure 110 comprises steps as follows: A patterned hard mask layer (not shown) is firstly provided on a top surface of the multi-layer stacking structure 110, and an anisotropic etching process, such as reactive ion etching (RIE) process is performed using the patterned hard mask (not shown) as an etching mask to remove a portion of the multi-layer stacking structure 110, so as to form a plurality of the O-shaped openings 103A-103F extending along the Z-axis. In the present embodiment, the patterning process may be stopped in the buried oxide layer 102 to make portions of the conductive layers 120, the insulating layers 130, the bottom gate layer 122 and the buried oxide layer 102 exposed from the O-shaped openings 103A-103F. In other words, these O-shaped openings 103A-103F may not penetrate through the bottom surface 102a of the buried oxide layer 102 to expose the semiconductor material of the substrate 101. The bottom 103Z of the O-shaped openings 103A-103F respectively have a height measured from the substrate 101 substantially higher than that of the bottom surface 102a of the buried oxide layer 102. However, the depths of the O-shaped openings 103A-103F are not limited to these regards. For example, in some embodiments of the present disclosure, the patterning process for forming the O-shaped openings 103A-103F may be stopped in the bottom gate layer 122. In other words, the O-shaped openings 103A-103F may not penetrate through the bottom gate layer 122 to expose the buried oxide layer 102. The O-shaped openings 103A-103F may have a bottom 103Z disposed on a location separated upwards from the bottom surface 122a of the bottom gate layer 122 for a distance, wherein the distance is about (but not limited to) ⅓ thickness of the bottom gate layer 122.

The "O-shaped opening (take the O-shaped openings 103B as an example)" as described here can be any recess structure extending into the multi-layers stacking structure 110 from the top surface 110a of the multi-layers stacking structure 110 along the Z-axis and having an O-shaped cross-sectional profile substantially parallel to the top surface 110a. In some embodiments of the present disclosure, the O-shaped cross-sectional profile can be a circle, an oval, and egg shape or a rounded rectangle. For example, in one embodiment, the "O-shaped opening" as described here can be a wedge-shaped opening flaring from the bottom to the top surface 110a of the multi-layers stacking structure 110 and having a plurality of rounded rectangular cross-sectional profiles parallel to the top surface 110a. In some embodiments of the present embodiments, the O-shaped cross-sectional profile can be an oval. According to the natures of the etching process for forming the O-shaped opening 103B, the oval cross-sectional profile of the portion of the O-shaped opening 103B adjacent to the top surface 110a of the multi-layers stacking structure 110 has a long axis with a length ranging from 160 nm to 200 nm and a short axis with a length ranging from 50 nm to 90 nm; and the oval cross-sectional profile of the portion of the O-shaped opening 103B adjacent to the bottom surface 122a of the bottom gate layer 122 has a long axis with a length ranging from 140 nm to 180 nm and a short axis with a length ranging from 30 nm to 70 nm. This design can balance the control ability on the top and bottom of the multi-layers stacking structure 110, and the processes subsequently performed thereon may be benefit with it. The rounded rectangular cross-sectional profile that is adjacent to the top surface 1110a has a size (about 70 nm×180 nm) greater than that adjacent to the bottom (a size of 50 nm×160 nm).

The O-shaped openings 103A-103F are arranged in rows along a direction parallel to the Y-axis, and arranged in columns along a direction parallel to the X-axis, so as to form an array of O-shaped openings. For example, the O-shaped openings 103B and 103C as well as the O-shaped openings 103E and 103F are arranged in two rows along the direction parallel to the Y-axis respectively; and the O-shaped openings 103B and 103E, the O-shaped openings 103A and 103D as well as the O-shaped openings 103C and 103F are arranged in three columns along the direction parallel to the X-axis respectively, so as to form a 2-by-3 array of O-shaped openings.

In some embodiments of the present disclosure, an O-shaped opening that is disposed between two adjacent O-shaped openings arranged in the same row may offset form a row line formed by the two center points of these two adjacent O-shaped openings, and an O-shaped opening that is disposed between two adjacent O-shaped openings arranged in the same column may offset form a column line formed by the two center points of these two adjacent O-shaped openings. For example, in the present embodiment, the O-shaped opening 103D that is disposed between the two adjacent O-shaped openings 103E and 103F arranged in the same row can offset from the row line A1 formed by the two center points of these two adjacent O-shaped openings 103E and 103F; and the O-shaped opening 103D that is disposed between the two adjacent O-shaped openings 103C and 103F arranged in the same column can offset from the column line A2 formed by the two center points of these two adjacent O-shaped openings 103C and 103F. By applying this arrangement, more O-shaped openings can be formed on an unit area of the top surface 110a of the multi-layers stacking structure 110.

Figure 3A:
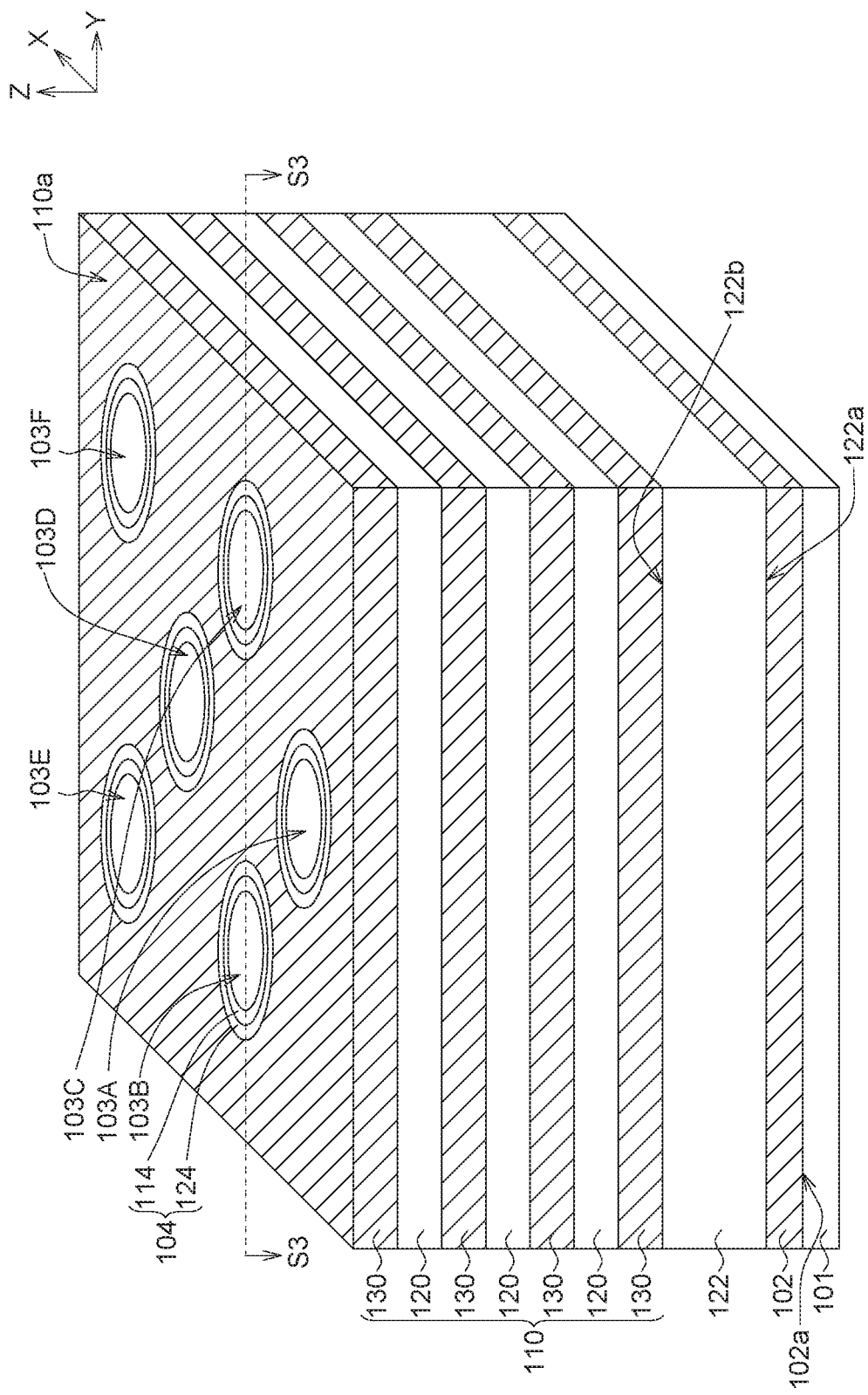
FIG. 3A is a prospective view illustrating the results after a memory structure layer is formed on the structure as depicted in FIG. 2A.
Figure 3B:
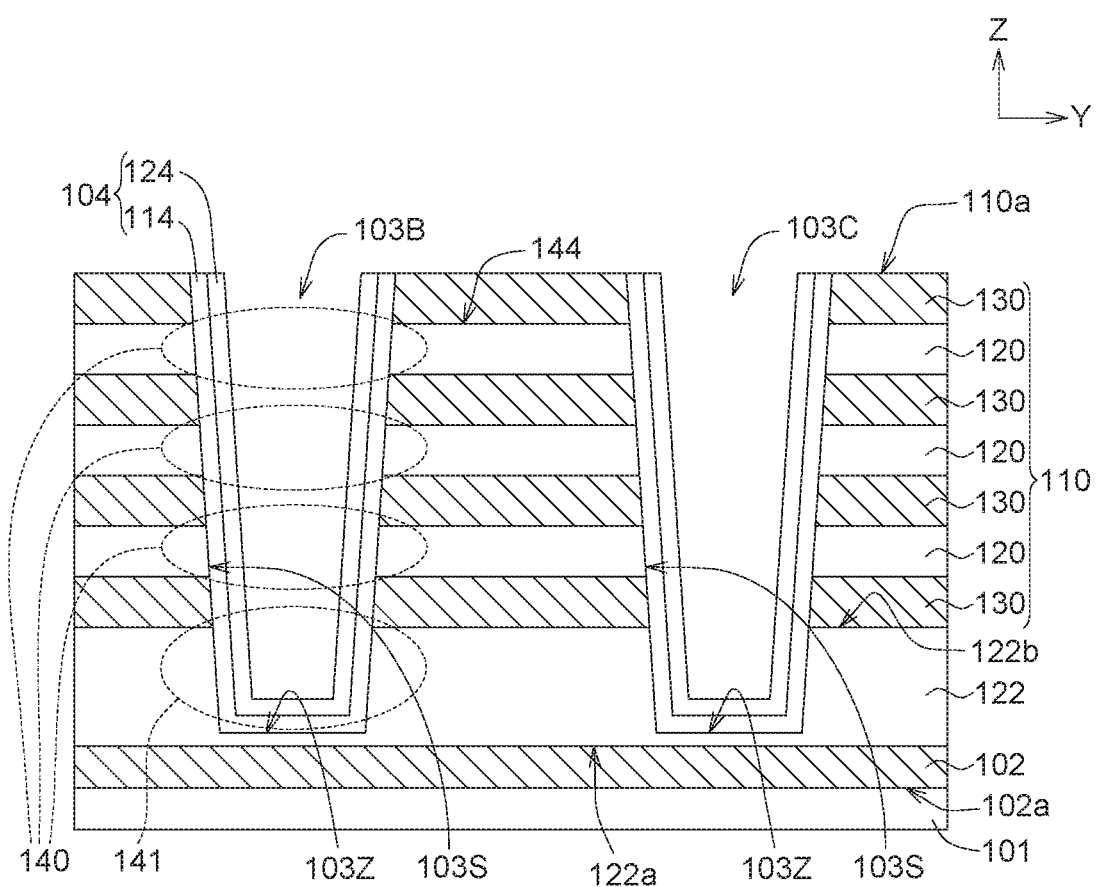
FIG. 3B is a cross-sectional view taken along the cutting line S3 as shown in FIG. 3A.

Thereinafter, a memory structure layers 104 is formed in each of the O-shaped openings 103A-103F respectively to cover the sidewall 103S and the bottom 103Z thereof. For the purpose of description convenience, thereinafter, the O-shaped opening 103B will be taken to be the example for further defining the structure of a single O-shaped opening. FIG. 3A is a prospective view illustrating the results after the memory structure layer 104 is formed on the structure as depicted in FIG. 2A; and FIG. 3B is a cross-sectional view taken along the cutting line S3 as shown in FIG. 3A.

In some embodiments of the present disclosure, the forming of the memory structure layer 104 may include steps as follows: A memory layer 114 is firstly formed on the multi-layers stacking structure 110 by a deposition process (such as a low pressure chemical vapor deposition (LPCVD)) and blanket over the sidewall 103S and the bottom 103Z of each O-shaped opening 103B. A channel layer 124 is then formed to cover the memory 124 by another deposition process (such as a LPCVD).

In some embodiment of the present disclosure, the memory layer 114 may be formed of a composite layer including a silicon oxide layer, a silicon nitride layer, and a silicon oxide layer (i.e., an ONO structure). However, the structure of the memory layer 114 is not limited to this regard. In some other embodiments, the composite layer of the memory material layer 114 may be selected from a group consisting of an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure. In the present embodiment, the memory layer 114 include an ONO structure and the channel layer 124 is made of poly-silicon.

A planarization process (such as a chemical-mechanical polishing (CMP) process) using the top surface 110a of the multi-layers stacking structure 110 as a stop layer is performed to remove the portions of the channel layer 124 and the memory layer 114 disposed on the top surface 110a of the multi-layers stacking structure 110, wherein a plurality of memory cells 140 are formed on the intersectional points of the conductive layer 120 and the memory structure layer 104 (the remaining portions of the channel layer 124 and the memory layer 114); at least one tunnel field-effect transistor switch 141 is formed on the intersectional points of the bottom gate layer 122 and the memory structure layer 104; and the plurality of memory cells 140 and the tunnel field-effect transistor switch 141 formed in each O-shaped opening 103B can be electrically connected in series by the corresponding channel layer 124 to form a GAA memory cell string 144.

Figure 4A:
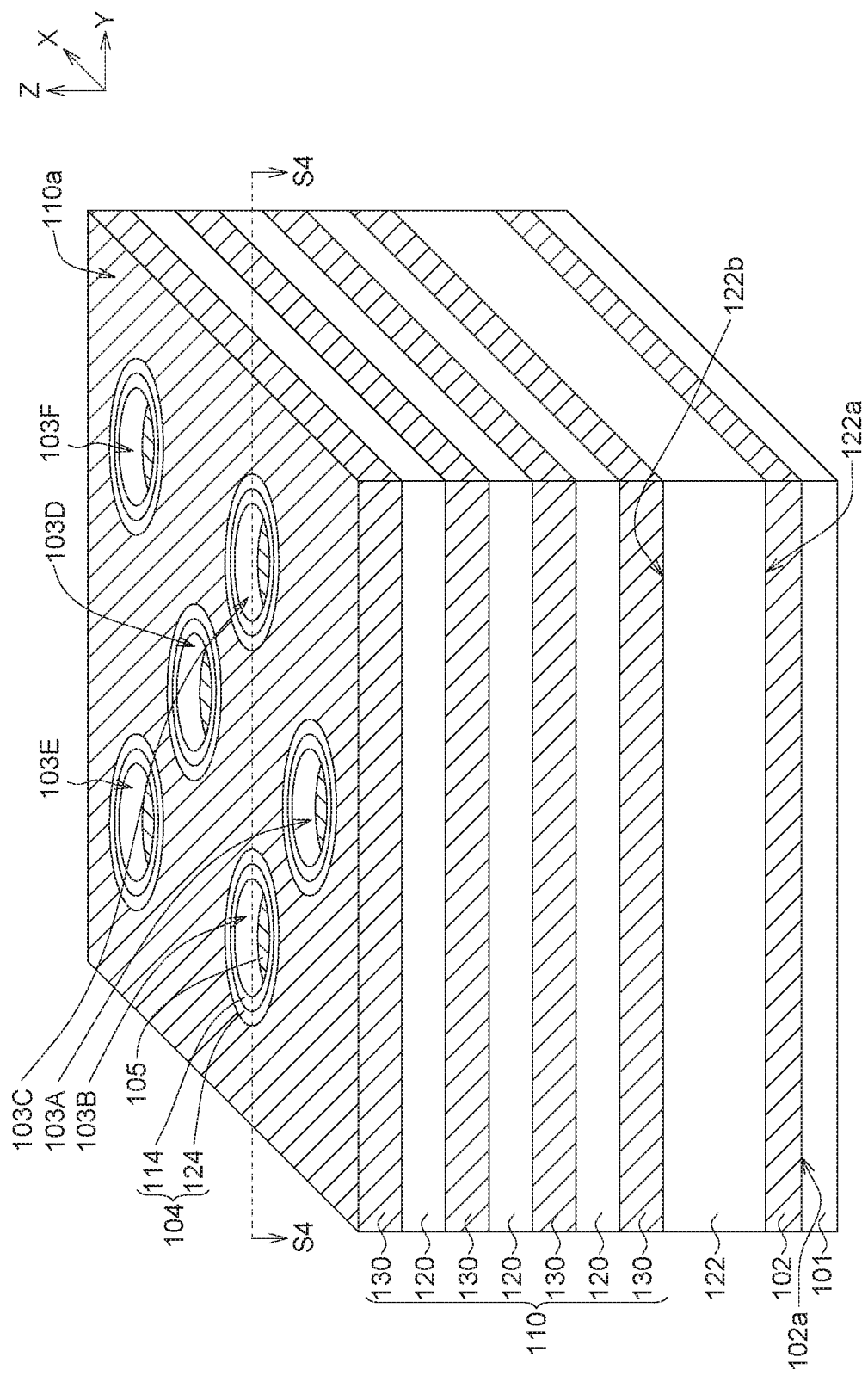
FIG. 4A is a prospective view illustrating the results after a plurality of dielectric pillars are formed in the structure as depicted in FIG. 3A.
Figure 4B:
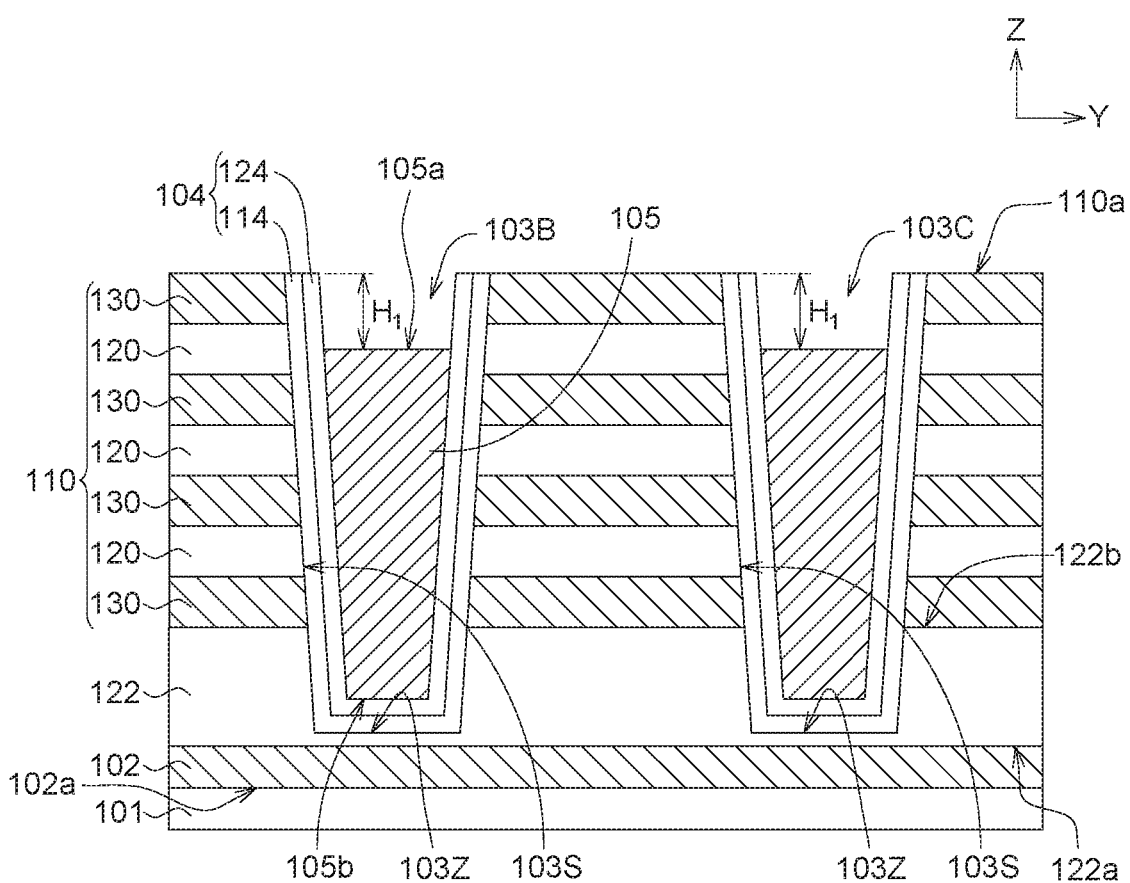
FIG. 4B is a cross-sectional view taken along the cutting line S4 as shown in FIG. 4A.

Thereafter, a dielectric pillar 105 is formed in each of the each O-shaped openings 103A-103F. FIG. 4A is a prospective view illustrating the results after a plurality of dielectric pillars 105 are formed in the structure as depicted in FIG. 3A; and FIG. 4B is a cross-sectional view taken along the cutting line S4 as shown in FIG. 4A.

In some embodiments of the present disclosure, the forming of the dielectric pillars 105 may include steps as follows: A dielectric material is deposited on the multi-layers stacking structure 110 and full-filling each of the O-shaped openings 103A-103F. A planarization process (such as a CMP process) using the top surface 110a of the multi-layers stacking structure 110 as a stop layer is performed to remove the portions of the dielectric material disposed on the top surface 110a of the multi-layers stacking structure 110, whereby a dielectric pillar 105 having an O-shaped cross-sectional profile parallel to the top surface 110a of the multi-layers stacking structure 110 can be formed in each of the O-shaped openings 103A-103F. An etching back process is then performed to remove a portion of the dielectric material disposed on the top portion of the dielectric pillars 105, so as to make a top surface 105a of the dielectric pillars 105 has a step distance H1 separated from the top surface 110a of the multi-layers stacking structure 110, and to make portions of the channel layers 124 exposed from each of the O-shaped openings 103A-103F.

Figure 5A:
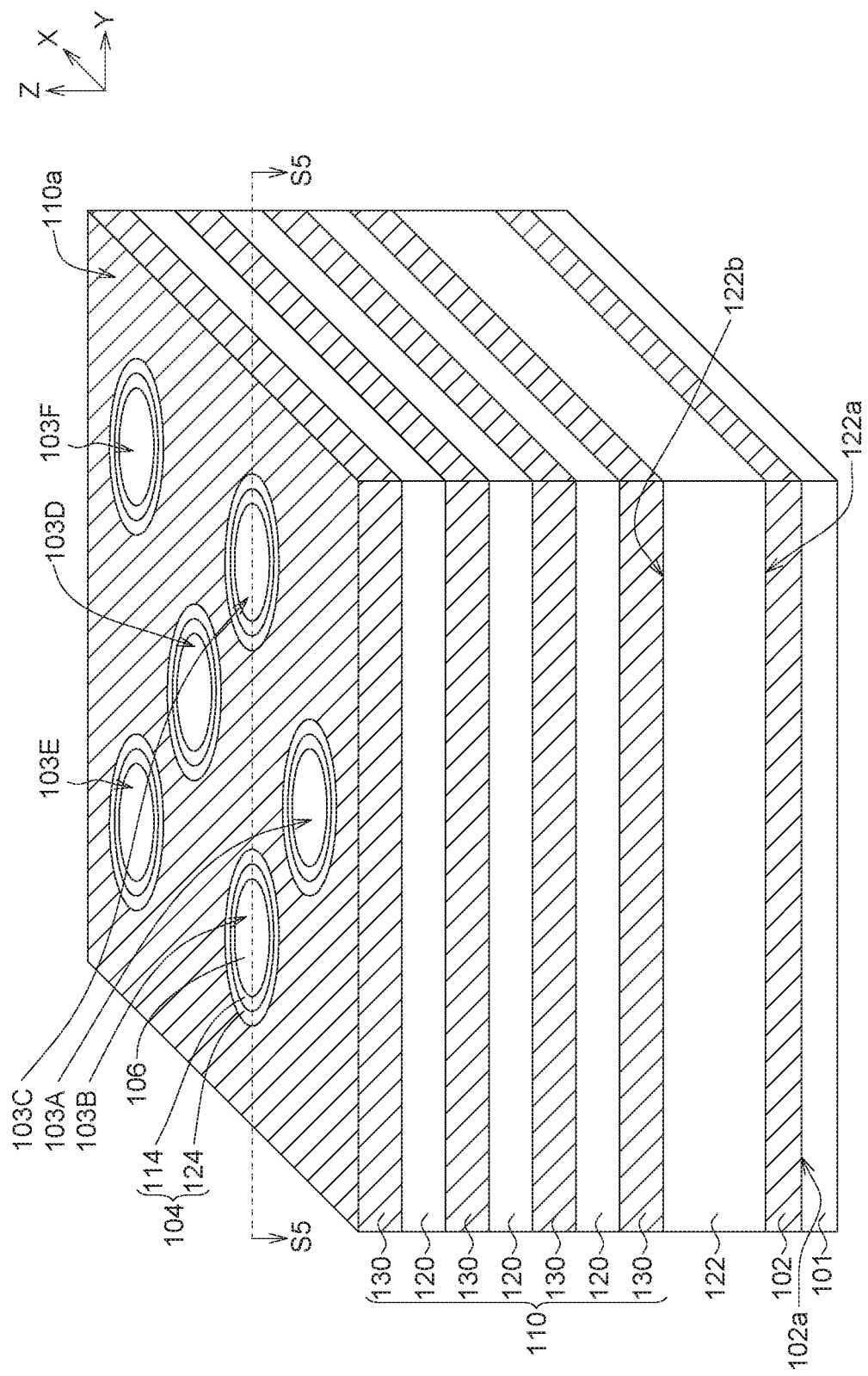
FIG. 5A is a prospective view illustrating the results after a plurality of column plugs are formed in the structure as depicted in FIG. 4A.
Figure 5B:
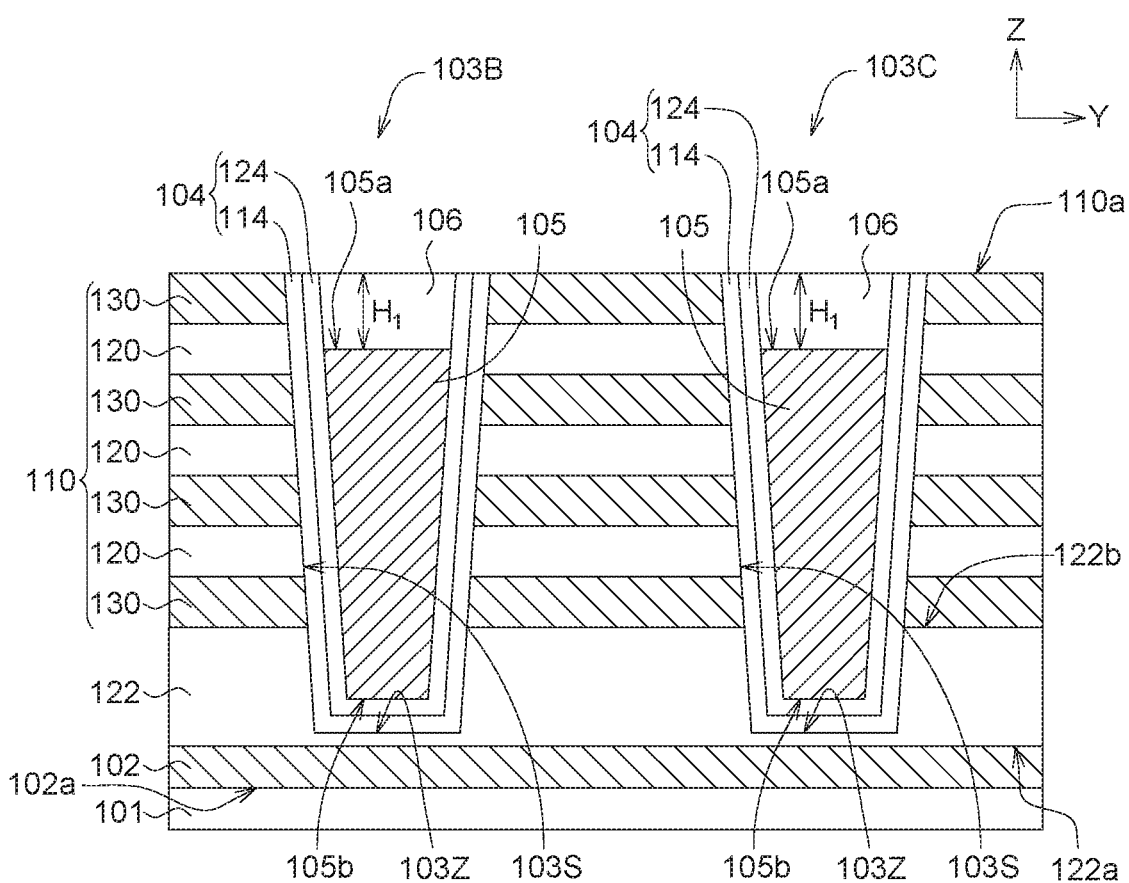
FIG. 5B is a cross-sectional view taken along the cutting line S5 as shown in FIG. 5A.

Next, a column plugs 106 is formed in each of the each O-shaped openings 103A-103F. FIG. 5A is a prospective view illustrating the results after a plurality of column plugs 106 are formed in the structure as depicted in FIG. 4A; and FIG. 5B is a cross-sectional view taken along the cutting line S5 as shown in FIG. 5A.

In some embodiments of the present disclosure, the forming of the column plugs 106 may include steps as follows: A conductive material is deposited on the multi-layers stacking structure 110 and full-filling each of the O-shaped openings 103A-103F to form a self-align contact with the exposed portion of the corresponding channel layer 124 in each of the O-shaped openings 103A-103F. A planarization process (such as a CMP process) using the top surface 110a of the multi-layers stacking structure 110 as a stop layer is performed to remove the portions of the conductive material disposed on the top surface 110a of the multi-layers stacking structure 110. The material used to constitute the column plugs 106 may include metal (such as Cu, Al, W or the metal ally thereof), doped or undoped semiconductor material (such as epitaxial single crystal silicon or poly-silicon (Si)/germanium (Ge) or other suitable material.

Figure 6A:
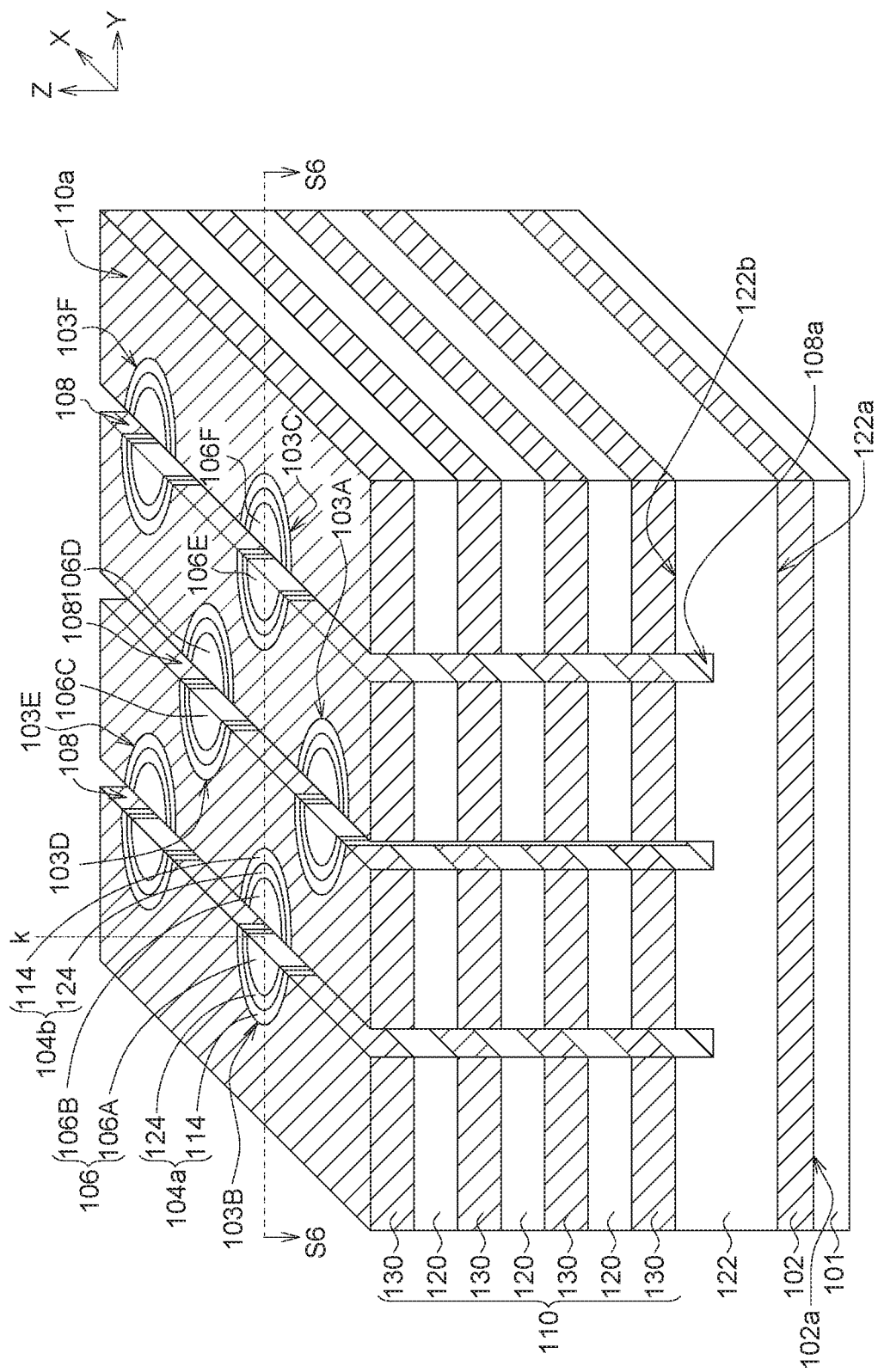
FIG. 6A is a prospective view illustrating the results after a plurality of grooves are formed in the structure as depicted in FIG. 5A.
Figure 6B:
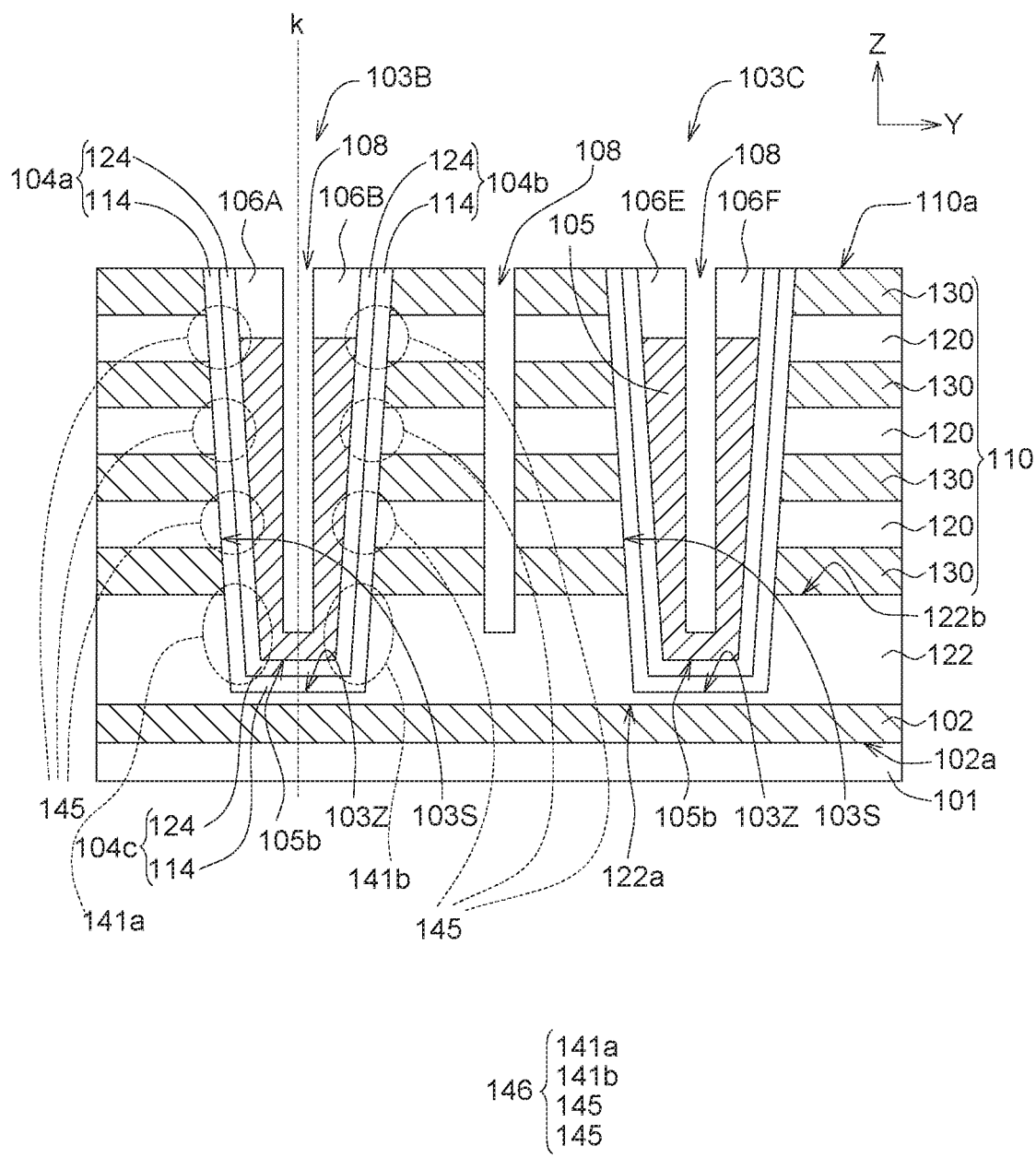
FIG. 6B is a cross-sectional view taken along the cutting line S6 as shown in FIG. 6A.

A plurality of grooves 108 are then formed in the multi-layers stacking structure 110 by an etching process, wherein each of the grooves corresponds to one of the O-shaped openings 103A-103F. FIG. 6A is a prospective view illustrating the results after a plurality of grooves 108 are formed in the structure as depicted in FIG. 5A; and FIG. 6B is a cross-sectional view taken along the cutting line S6 as shown in FIG. 6A.

In some embodiments of the present disclosure, each groove 108, in one hand, extends downward from the top surface 110a of the multi-layers stacking structure 110 along the direction parallel to the Z-axis and passes through the column plug 106, a portion of the memory structure layer 104 and a portion of the dielectric pillar 105 formed in the corresponding O-shaped opening (e.g. the O-shaped opening 103B). And in another hand, the groove 108 extends along the direction parallel to the X-axis beyond the sidewall 103S of the corresponding O-shaped opening 103B, so as to passing through the memory structure layer 104 at two opposite ends thereof and go into the multi-layers stacking structure 110, to divide the column plug 106 into two separated contact plugs (such as a contact plug 106A and a contact plug 106B), and to divide the memory structure layer 104 into a first string portion 104a disposed on one end of the sidewall 103S, a second string portion 104b disposed on the other end of the sidewall 103S, and a connection portion 104c disposed on the bottom 103Z of the corresponding O-shaped opening 103B and used to connecting the first string portion 104a with the second string portion 104b.

In the present embodiment, the groove 108 may not extend downwards beyond the bottom surface 105b of the dielectric pillar 105 along the direction parallel to the Z-axis. Such that the groove 108 does not cut through the portion of the memory structure layer 104 (referred to as a connection portion 104c) disposed on the bottom 103Z of the corresponding O-shaped opening 103B. For example, the groove 108 may have a bottom 108a disposed on a location separated downwards from the top surface 122b of the bottom gate layer 122 for a distance, wherein the distance is about (but not limited to) ⅓ thickness of the bottom gate layer 122. Besides, the groove 108 may extend along the direction parallel to the X-axis beyond the sidewall 103S of the corresponding O-shaped opening 103B, so as to laterally passing through the memory structure layer 104 at two opposite ends thereof and go into the multi-layers stacking structure 110, wherein the groove 108 can divide the portion of the memory structure layer 104 disposed on the sidewall 103S into the first string portion 104a and the second string portion 104b separated with each other, and the first string portion 104a and the second string portion 104b can be connected by the connection portion 104c of the memory structure layer 104 disposed on the bottom 103Z of the corresponding O-shaped opening 103B to form a U-shaped memory structure layer in the corresponding O-shaped opening 103B.

Since the portion of the memory structure layer 104 that is blanket over the sidewall 103S of each O-shaped opening 103B has an O-shaped cross-sectional profile parallel to the top surface 110a of the multi-layers stacking structure 110, thus when the corresponding groove 108 penetrate through to divide the portion of the memory structure layer 104 disposed on the sidewall 103S into the first string portion 104a and the second string portion 104b, the first string portion 104a and the second string portion 104b can respectively have a U-shaped (e.g. a half of a cutting O-shape) cross-sectional profile parallel to the top surface 110a of the multi-layers stacking structure 110.

In addition, because the groove 108 does not cut through the connection portion 103c of the memory structure layer 104 that is disposed on the bottom 103Z of the corresponding O-shaped opening 103B, the first string portion 104a and the second string portion 104b can be connected by the connection portion to form a U-shaped memory structure layer having a central axis K parallel to the Z-axis. A plurality of memory cells 145 thus can be formed on the intersectional points of the U-shaped memory structure layer and the conductive layer 120, wherein the memory cells 145 can be electrically connected in series by the channel layer 124 included in the U-shaped memory structure layer to form a U-shaped memory cell string 146, wherein each of the memory cells 145 may have a U-shaped channel profile parallel to the top surface 110a of the multi-layers stacking structure 110, since the memory cells 145 are respectively formed on the points of the conductive layer 120 intersecting with first string portion 104a and the second string portion 104b both having the U-shaped cross-sectional profile.

In some embodiments of the present disclosure, each of the grooves 108 can divide each of the GAA memory cell string 144 that is formed in the corresponding O-shaped opening (e.g the O-shaped opening 103B) into two sub-cells strings connected by the connection portion 104c of the memory structure layer 104. Each one of the memory cells 140 (see FIG. 3) used to constitute the GAA memory cell string 144 can be divided into two memory cells 145 having an U-shaped channel profile; and the tunnel field-effect transistor switch 141 (see FIG. 3) used to constitute the GAA memory cell string 144 can be divided into two tunnel field-effect transistor switches 141a and 141b with an U-shaped channel profile. The memory cells 145 and the tunnel field-effect transistor switch (such as the tunnel field-effect transistor switch 141a) that are stacked at the same side can be connected by the first string portion 104a (or the second string portion 104b) to form one of these two sub-cells strings; and these two sub-cells strings can be connected by the connection portion 104c to form the U-shaped memory cell string 146. Such that, the U-shaped memory cell string 146 can have twice number of memory cells (i.e. the memory cells 140) as many as that the GAA memory cell string 144 has. In the present embodiment, the tunnel field-effect transistor switches 141a and 141b may serve as the inversion assist gates (IGs).

In comparison with a prior art 3D memory device (such as a single-gate vertical channel (SGVC) NAND flash memory device) having an U-shaped memory cell string structure, the memory cell used to constitute the prior art U-shaped memory cell string structure has a plane channel architecture, and each of the memory cells 145 involved in the U-shaped memory cell string 146 may have an U-shaped channel profile. Each of the memory cells 145 with the U-shaped channel profile has a channel width greater than that of the prior art memory cell with a plane channel architecture, when they have an identical critical size. In other words, when the channel with of the memory cells 145 is relatively shrunk or the operation voltage of the e memory cells 145 is proportionally reduced, the performance thereof can be still identical to that of the prior art memory cells. The device size of the memory cells 145 can be reduced by shrinking the channel with thereof of. Alternatively, benefit from the reducing of the operation voltage to alleviate the interference occurs between these two adjacent cell strings 146, the pitch between two adjacent cell strings 146 constituted by the memory cells 145 can be reduced. Such that, more U-shaped memory cell strings 146 can be formed in the multi-layers stacking structure 110. As a result, the storage density of the 3D memory device 100 can be significantly increased.

Figure 7A:
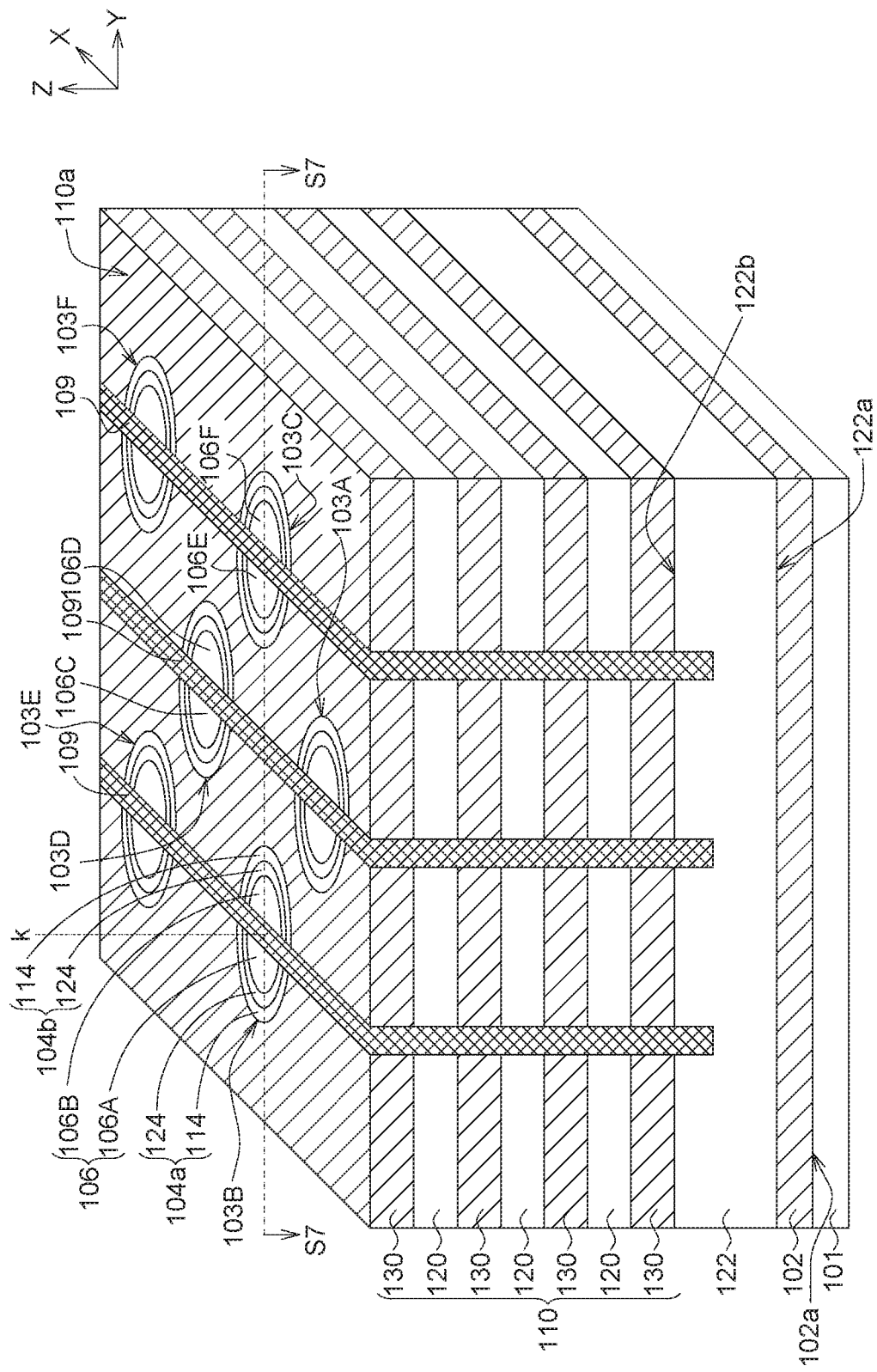
FIG. 7A is a prospective view illustrating the results after a plurality of isolation bodies are formed in the structure as depicted in FIG. 6A.
Figure 7B:
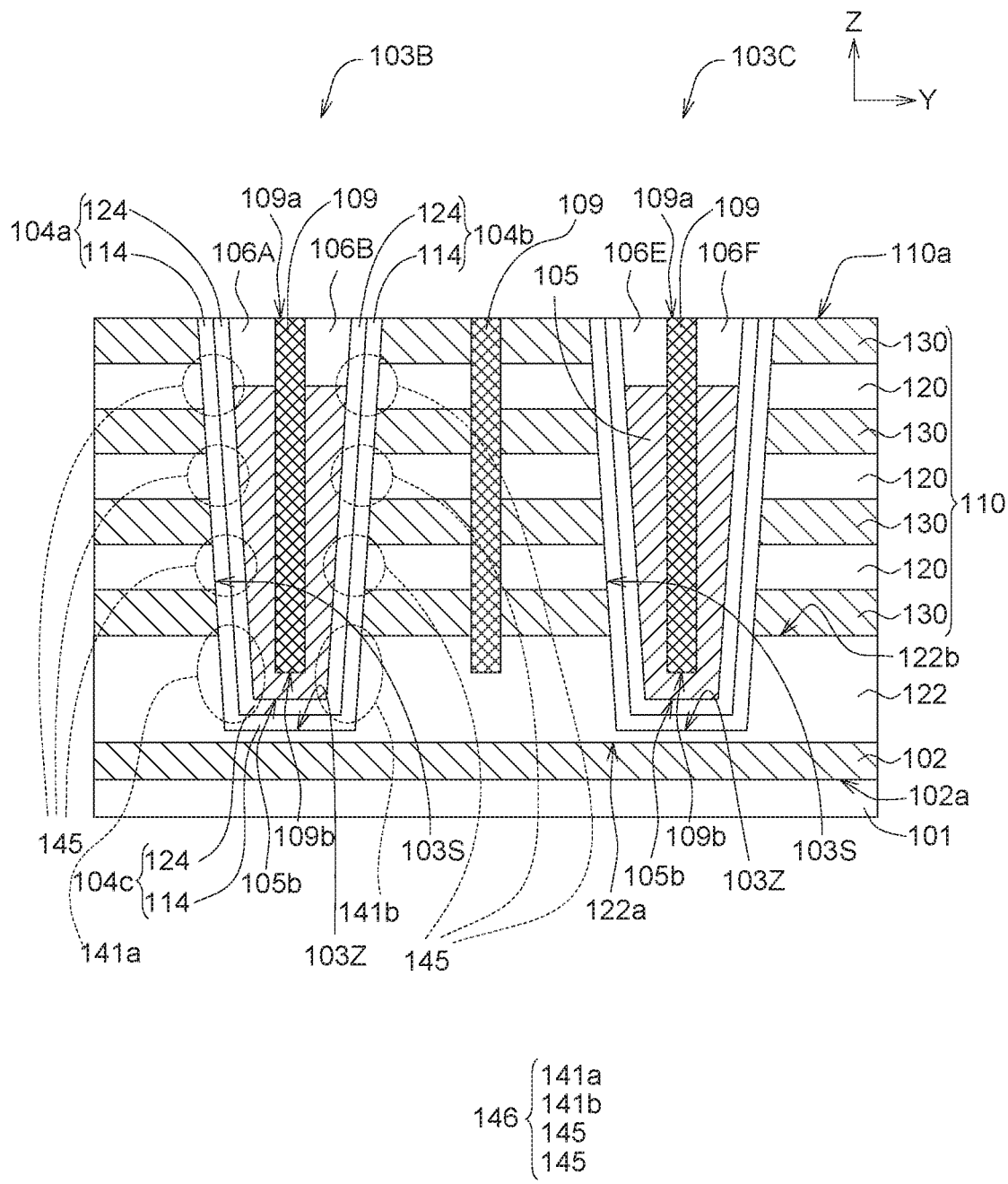
FIG. 7B is a cross-sectional view taken along the cutting line S7 as shown in FIG. 7A.

Subsequently, an isolation body 109 embedded among the first string portion 104a, the second string portion 104b and the connection portion 104c is formed. FIG. 7A is a prospective view illustrating the results after a plurality of isolation bodies 109 are formed in the structure as depicted in FIG. 6A; and FIG. 7B is a cross-sectional view taken along the cutting line S7 as shown in FIG. 7A.

Figure 8:
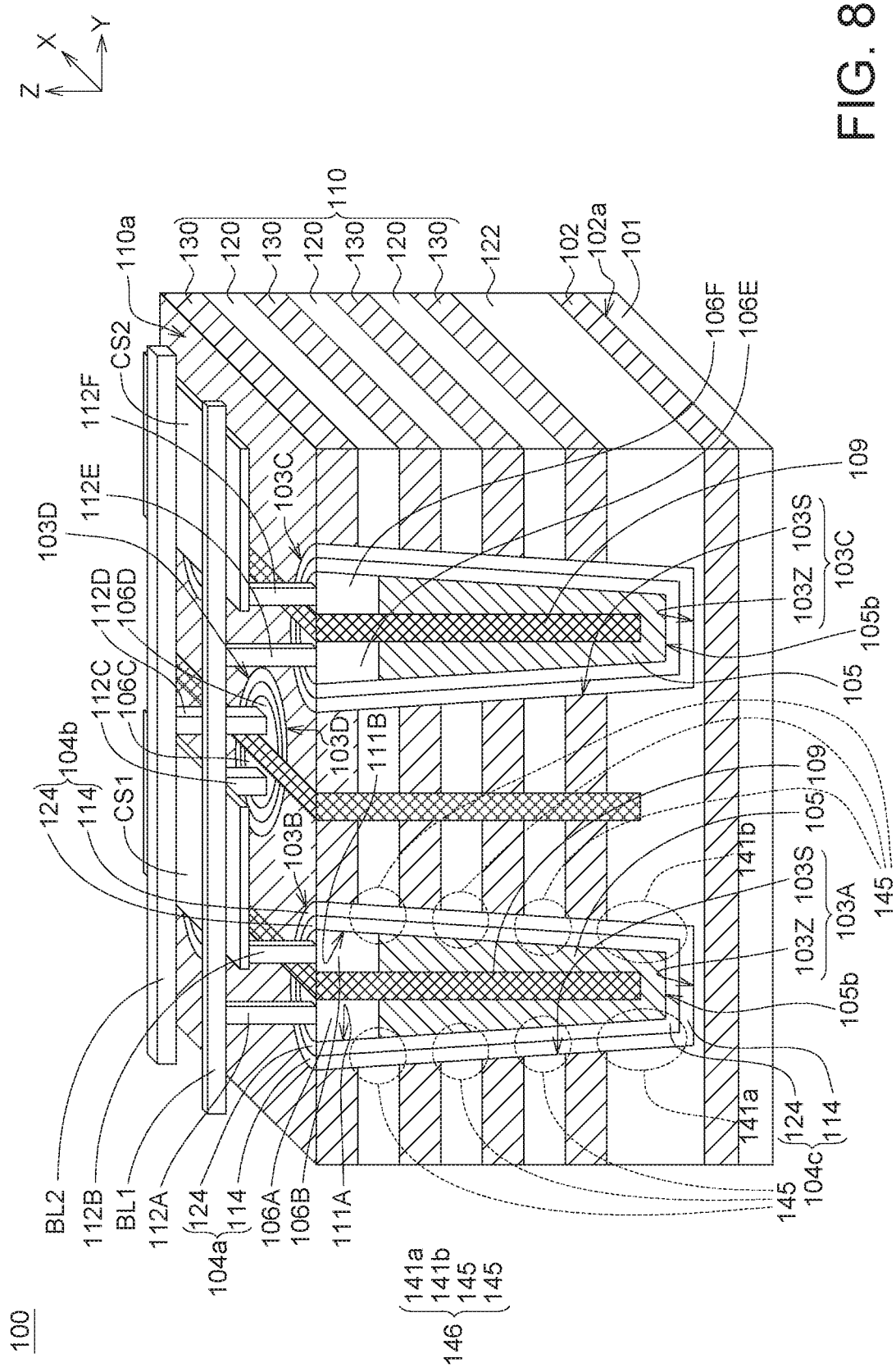
FIG. 8 is a prospective view illustrating a 3D memory device in accordance with one embodiment of the present embodiment.

In some embodiments of the present disclosure, the forming of the isolation body 109 may include steps as follows: An insulation material is deposited on the top surface 110a of the multi-layers stacking structure 110 to full-fill each of the grooves 108 and covering the contact plug 106A and the contact plug 106B. A planarization process (such as a CMP process) using the top surface 110a of the multi-layers stacking structure 110 as a stop layer is performed to remove the portions of the insulation material disposed on the contact plug 106A, the contact plug 106B and the top surface 110a of the multi-layers stacking structure 110. In the present embodiment the isolation body 109 has a top surface 109a substantially conformal with the top surfaces of the contact plug 106A and the contact plug 106B as well as the top surface 110a of the multi-layers stacking structure 110. In other words, the top surface 109a of the isolation body 109 also separates from the top surface 105a of the dielectric pillars 105 for the step distance H1. The isolation body 109 has a bottom 109b After a series of downstream processes are carried out to form a plurality of interconnection structures for connecting the contact plugs respectively formed in each of the O-shaped openings 103A-103F to the corresponding bit lines or source lines, the 3D memory device 100 as shown in FIG. 8 can be obtained. For example, in the present embodiment, the contact plug 106A and the contact plug 106E respectively formed in the O-shaped openings 103B and 103C are connected to a first bit line BL1 by the interconnection structures 112A and 112E respectively; the fourth contact plug 106D formed in the O-shaped openings 103D is connected to a second bit line BL2 by the interconnection structure 112D; the contact plug 106B and the contact plug 106C respectively formed in the O-shaped openings 103B and 103C are connected to a common source line CS1 by the interconnection structures 112B and 112C respectively; and the sixth contact plug 106F formed in the O-shaped opening 103C is connected to a common source line CS2 by the interconnection structure 112F.

Because the contact plug 106A is a self-align contact formed in a first recess 111A defined in the O-shaped opening 103B by the dielectric pillar 105, the isolation body 109 and the first string portion 104a; and the contact plug 106B is a self-align contact formed in a second recess 111B defined in the O-shaped opening 103B by the dielectric pillar 105, the isolation body 109 and the second string portion 104b. The contact plug 106A and the contact plug 106B can be directly connect to the channel layer 124 of the first string portion 104a and the second string portion 104b that are respectively exposed from the recess 111A and the second recess 111B. In addition, since the contact plug 106A and the contact plug 106B that have a lateral dimension far greater than that of the first string portion 104a and the second string portion 104b can provide a landing area for the interconnection structures 112A and 112B forming thereon to connect the first string portion 104a and the second string portion 104b to the corresponding bit line BL1 and the common source line CS1 respectively. Additional metal deposition and patterning process for forming conductive contact pads on the contact plug 106A and the contact plug 106B for providing the landing area like the prior art 3D memory device does thus are not necessary. The process for fabricating the 3D device 100 can be simplified and the manufacturing cost can be decreased.

In accordance with the aforementioned embodiments of the present disclosure, a 3D memory device and the method for fabricating the same are provided. A patterned multi-layers stacking structure having a least one trench is firstly provided on a substrate.

In accordance with the aforementioned embodiments of the present disclosure, a 3D memory device and the method for fabricating the same are provided. A patterned multi-layers stacking structure having a least one O-shaped opening is firstly provided on a substrate. A memory structure layer (including a memory layer and a channel layer) is then formed on the sidewall and the bottom of the O-shaped opening to form a GAA memory cell string therein. Next the O-shaped opening is full-filled with a dielectric material, an etching back process is then performed to remove a portion of the dielectric material from the O-shaped opening, and the O-shaped opening is further full-filled with a conductive material, whereby a dielectric pillar and a column plug stacking in series can be formed in the O-shaped opening. Subsequently, an etching process is performed to form a groove to divide the column plug into two separated contact plugs and to divide the GAA memory cell string into two sub-memory cell strings connecting by the remaining (not being etched) portion of the memory structure layer disposed on the bottom of the O-shaped opening. As a result, an U-shaped memory cell string having a vertical channel is formed, wherein each of the cells used to constitute the U-shaped memory cell string has a U-shaped channel profile parallel to the top surface of the multi-layers stacking structure.

Because, the cells having a U-shaped channel profile may have a greater channel width, in comparison with the prior art memory cells having a plane channel structure, thus when the size of the memory cells having the U-shaped channel profile is relatively shrunk or the pitch between two adjacent cell strings constituted by the memory cells having the U-shaped channel profile is proportionally reduced, the performance thereof can be still identical to that of the prior art memory cells. Such that, more U-shaped memory cell strings can be formed in the multi-layers stacking structure. As a result, the storage density of the 3D memory device can be significantly increased. In addition, since the contact plugs can provide a landing area for the subsequent process performing hereon, the conductive contact pads provided by the prior art thus are not necessary. The process for fabricating the 3D device can be simplified and the manufacturing cost can be decreased.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) memory device, comprising:
   a substrate;
   a plurality of conductive layers;
   a plurality of insulating layers, alternately stacked with the conductive layers on the substrate to form a multi-layers stacking structure, wherein the multi-layers stacking structure has at least one O-shaped opening passing through the conductive layers and the insulating layers;
   a memory structure layer, having a first string portion disposed on one side of a sidewall of the at least one O-shaped opening, a second string portion disposed on another side of the sidewall and a first connection portion disposed on a bottom of the at least one O-shaped opening and used to connecting the first string portion and the second string portion;
   a dielectric pillar, disposed in the at least one O-shaped opening and over the first connection portion;
   an isolation body, extending along a first direction from a top surface of the multi-layers stacking structure towards to the substrate and embedded among the first string portion, the second string portion and the first connection portion to isolate the first string portion from the second string portion;
   a first contact plug, disposed in a first recess defined by the first string portion, the dielectric pillar and the isolation body; and
   a second contact plug, disposed in a second recess defined by the second string portion, the dielectric pillar and the isolation body.

2. The 3D memory device according to claim 1, wherein the isolation body extends along the first direction and embedded in the dielectric pillar; and extends along a second direction perpendicular to the first direction and beyond the sidewall of the at least one O-shaped opening to isolate the first string portion from the second string portion.

3. The 3D memory device according to claim 1, wherein the first string portion and the second string portion have an U-shaped cross-sectional profile parallel to the top surface of the multi-layers stacking structure.

4. The 3D memory device according to claim 1, further comprising:
   a bit line, disposed on the top surface of the multi-layers stacking structure, extending along a third direction and electrically connecting to the first contact plug; and
   a common source line, disposed on the top surface of the multi-layers stacking structure, extending along a second direction perpendicular to the first direction and electrically connecting to the second contact plug.

5. The 3D memory device according to claim 4, wherein the multi-layers stacking structure comprises a plurality of O-shaped openings arranged respectively along the second direction and the third direction to form an O-shaped openings array having a plurality of O-shaped openings rows extending along the second direction; and a reference O-shaped opening disposed on one of the O-shaped openings rows is shift for a distance along the second direction from a neighbor O-shaped opening disposed on another one of the O-shaped openings rows adjacent to the one of the O-shaped openings rows.

6. The 3D memory device according to claim 5, wherein the reference O-shaped opening is corresponding to the second contact plug; the neighbor O-shaped opening is corresponding to an equal one of the second contact plug; and the second contact plug and the equal one of the second contact plug are both electrically connected to the source line.

7. The 3D memory device according to claim 5, wherein the reference O-shaped opening is corresponding to the first contact plug; the other O-shaped openings disposed one the same one of the O-shaped openings rows are corresponding to plural equal ones of the first contact plug; and the first contact plug and the plural equal ones of the first contact plug are both electrically connected to the bit line.

8. The 3D memory device according to claim 1, wherein the memory structure layer comprises:
   a memory layer, blanket over the sidewall and the bottom of the at least one O-shaped opening; and
   a channel layer, blanket over the memory layer.

9. The 3D memory device according to claim 1, wherein the dielectric pillar has a first surface departing from the substrate, the isolation body has a second surface substantially conformal with the top surface of the multi-layers stacking structure; and the second surface separates from the first surface for a step distance.

10. The 3D memory device according to claim 1, further comprising:
   a buried oxide layer disposed between the substrate and the multi-layers stacking structure; and
   a bottom gate layer disposed between the buried oxide layer and the multi-layers stacking structure.

11. The 3D memory device according to claim 10, wherein the at least one O-shaped opening has a bottom disposed on a location separated upwards from a bottom surface of the bottom gate layer for a distance, wherein the distance is about ⅓ thickness of the bottom gate layer.

12. The 3D memory device according to claim 10, wherein the isolation body has a bottom disposed on a location separated downwards from a top surface of the bottom gate layer for a distance, wherein the distance is about ⅓ thickness of the bottom gate layer.

13. The 3D memory device according to claim 1, further comprising a plurality of memory cells formed on a plurality of intersectional points the conductive layer intersecting the first string portion and the second string portion.

14. The 3D memory device according to claim 13, wherein the memory cells are electrically connected in series by a channel layer of the memory structure layer to form a U-shaped memory cell string.

15. The 3D memory device according to claim 14, wherein each of the memory cells has a U-shaped channel profile parallel to a top surface of the multi-layers stacking structure.

* * * * *